United States Patent [19]
Alberts
[11] 3,767,490
[45] Oct. 23, 1973

[54] PROCESS FOR ETCHING ORGANIC COATING LAYERS

[75] Inventor: Gene S. Alberts, Essex Junction, Vt.
[73] Assignee: International Business Machines Corporation, Armonk, N.Y.

[22] Filed: June 29, 1971
[21] Appl. No.: 157,970

[52] U.S. Cl. .......................... 156/2, 156/11, 156/13
[51] Int. Cl. .......................... H05k 3/06
[58] Field of Search .......................... 156/11, 13, 2

[56] References Cited
UNITED STATES PATENTS

| | | | |
|---|---|---|---|
| 3,705,055 | 12/1972 | Christensen et al. | 156/2 |
| 2,443,373 | 6/1948 | Borsoff | 134/20 |

OTHER PUBLICATIONS

Burrage et al. Photoresist Removal In Ozone-Cutg Atmosphere IBM Discl. Bul. Vol. 10 No. 8 January, 1969 p. 1260

*Primary Examiner*—Jacob H. Steinberg
*Attorney*—Hanifin and Jancin

[57] ABSTRACT

Polyimide and other relatively inert organic insulating layers may be selectively etched by applying a masking layer to the polyimide in a desired pattern, then contacting the unmasked portions of the polyimide with ozone at an elevated temperature. When the polyimide overlies aluminum films, such as in the passivation of integrated circuits, the ozone etches the polyimide down to the aluminum film, but does not attack the aluminum. If a photoresist is utilized as the masking layer, the ozone removes the photoresist at the same time it etches the unmasked portions of the polyimide.

6 Claims, 4 Drawing Figures

PATENTED OCT 23 1973 3,767,490

INVENTOR
GENE S. ALBERTS
BY Willis E. Higgins
ATTORNEY

PROCESS FOR ETCHING ORGANIC COATING LAYERS

BACKGROUND OF THE INVENTION

1. Field of the Invention

This invention relates to a process for the selective etching of organic coating materials. More particularly, it relates in one form to such a process in which metallic films or other inorganic substrates underlying the organic coating materials are not subject to attack. In another form, the invention relates to a simplified, one step selective etching process for organic coating materials in which a masking layer covering portions of the organic coating material not to be etched is removed at the same time that unmasked portions of the coating materials are etched.

2. Description of the Prior Art

It is known to employ an aqueous alkali metal hydroxide solution as an etchant for a polyimide coating. For example, such a process for etching a polyimide coating on electrical cables is disclosed in U.S. Pat. No. 3,331,718. Such a process has been successful as applied to such conductors as aluminum when present in bulk thicknesses, because the alkali metal hydroxides attack the polyimide at a much more rapid rate than the aluminium. However, such a process is of only limited value in the etching of polyimide coatings on integrated circuits, in which thicknesses of the order of 10,000 Angstroms are employed for aluminum interconnections in the integrated circuits. With such thin film aluminum layers, the alkali metal hydroxides attack the aluminum at a sufficient rate to be a problem once the polyimide over the aluminum has been removed. A further limitation on the use of alkali metal hydroxides for etching polyimide is that they will not etch most fully cured polyimides satisfactorily. It is therefore necessary to cure most polyimides only partially prior to etching, then complete the cure in a separate step after etching with the hydroxides has been carried out.

The use of ozone for removing photoresist from semiconductor wafers is known, as disclosed by Burrage et al, IBM Technical Disclosure Bulletin, January 1968, page 1260.

Further, etching processes in which both a masking layer and an unmasked portion of a substrate to be etched are removed simultaneously are disclosed in, for example, U.S. Pat. Nos. 3,236,707 and 3,483,108.

In spite of the fact that the etching art is a well developed one, there still remains a need for an etching process suitable for use with relatively inert organic insulating materials, in order to allow such organic insulating materials to be employed as passivating layers in integrated circuits. This means that both the organic insulating layer and a masking layer used to protect that portion of the insulating material not to be removed from the etchant must be capable of removal under conditions that will not attack thin film metallurgy, such as aluminum films employed as interconnection metallurgy in the integrated circuit.

SUMMARY OF THE INVENTION

Accordingly, it is an object of the invention to provide a process for etching relatively inert organic insulating materials which are suitable for passivating integrated circuits, without attacking thin film metallurgy underlying the insulating material.

It is a further object of the invention to provide a novel process for selective etching of organic coating materials in which a mask protecting portions of the organic coating material is removed at the same time etching of the organic coating material takes place.

It is yet another object of the invention to provide a process for etching polyimide over an aluminum film which does not attack the film when it has been exposed.

It is still another object of the invention to enable a relatively inert organic insulating material to be employed as a passivating layer for an integrated circuit and enable contact holes to be etched through the passivating layer under integrated circuit manufacturing conditions.

It is another object of the invention to provide an etching process for polyimides which is capable of etching most or all polyimides in the fully cured state.

The attainment of these and related objects may be achieved with the present process for etching organic coating materials. In this process, a first organic material which is to be selectively removed from portions of a substrate is masked with a second layer of a material, also desirably organic, in a pattern corresponding to those areas of the first organic material to be retained on the substrate. The unmasked portions of the first organic material and the second layer of a masking material are then contacted with ozone. The ozone removes unmasked portions of the first material from the substrate. Simultaneously, the second layer forming the mask, if of an organic material, is simultaneously removed from the first material. The first organic material is desirably polyimide, and the second layer is desirably a photoresist.

If a material which is free of attack by ozone is employed as the substrate, such as most metals and inorganic materials, both the unmasked organic coating material and the second layer of masking material may be removed while maintaining the substrate intact, thus defining the desired pattern of polyimide or other organic coating material on the substrate. Overetching is thus not a critical problem in this process, because it does not result in attack of the substrate.

While the subject process is especially suited for meeting the demands of etching polyimide passivating layers on integrated circuits, the present process should find wide application for the etching of organic coating materials in other environments as well, since the process consists of one simple step which accomplishes the desired etching and may remove the masking layer as well, if it is also an organic material, while avoiding attack on the substrate material.

The process of this invention may be carried out on a wide variety of substrate materials. In order to avoid problems of determining exactly when etching down to the substrate has been completed, the substrate should be a material which is substantially inert to attack by the ozone at the temperature employed for the selective removal of the organic insulating material. Suitable examples of such materials include inorganic insulating materials, such as silicon dioxide, silicon nitride, glasses, and the like; metals, such as aluminum, copper, molybdenum, chromium, gold, and the like.

Essentially any organic coating material may be etched in accordance with this invention, since they virtually all are subject to attack by ozone. Suitable examples include the phenolics, such as phenolformaldehyde resins, melamine resins, alkyds, epoxies, polyesters, acrylic resins, polyhaloaliphatics, such as polyvinyl chloride, polyvinylidene chloride, polytetrafluoroethylene, and the like; high temperature stable resins, such as polyimides, polyamide-imide resins, poly-p-xylene, polyphenylene oxide, and the like.

Especially preferred for use in practice of this invention are the polyimides and polyimide co-polymers. Polyimides may be prepared by methods known in the art, such as by reacting an aromatic tetracarboxylic dianhydride, such as pyromellitic dianhydride, and an aromatic diamine. Such polyimides are commercially available under the trademarks "Kapton" and "Pyre-ML", from E. I. DuPont DeNemours and Company, Incorporated, Wilmington, Del.

In addition to the above materials, the organic coating layer to be etched in accordance with the invention can be a photoresist layer, as is more fully explained below.

While essentially any material may be used as a masking layer on top of the organic coating material, it is most convenient to employ a photoresist for this purpose. Either a positive or a negative photoresist may be employed, and applied to the organic coating material in a predetermined pattern by conventional techniques. Suitable specific examples of such photoresists include the compositions based on polyvinyl cinnamate, polyisoprene, natural rubber resins, formaldehyde novolaks, cinnamylidene or polyacrylic esters. Examples of these photoresists include commercially available KPR–2, a polyvinyl cinnamate based composition having a molecular weight of from 14,000 to 115,000, KTFR, a partially cyclized polymer of cis-1,4-isoprene having an average molecular weight of from 60,000 to 70,000; KMER, a natural rubber resin based composition; Shipley AZ–1350, an m-cresol formaldehyde novolak resin composition; and KOR, a cinnamylidene or poly-β-styril acrylic ester coating composition. These photoresists normally contain small amounts of a photoinitiator or a photosensitizer which decomposes under the action of ultraviolet light to yield a free radical species which initiates the polymerization or depolymerization reaction. Especially suitable photoinitiators, well known in the art, include the axides, such as 2,6-bis(p-azidobenyzlidene)-4-methyl-cyclo-hexane, the diazo oxides, such as the 1-oxo-2-diazo-5-sulfonate ester of napthalene, and the thioazo compounds, such as 1-methyl-2-m-chloro-benzoylmethylene-β-naphtho-thiazoline, as disclosed in U.S. Pat. No. 2,732,301.

One manner in which the invention may be carried out is to utilize a photoresist both as the organic coating material and as the masking material. This would be of advantage where the developer for the photoresist would attack the substrate, as may often be the case with positive photoresists, which typically use a strong alkali developer. This is done by applying a first layer of photoresist to the substrate, exposing the entire layer to light and post baking in a conventional manner in the case of a negative resist, or heating to polymerize the resist further in the case of a positive resist, then applying a second layer of photoresist over the first layer. This layer is selectively exposed to light to give a desired pattern, then developed according to conventional procedures. The first photoresist layer is then etched using ozone, with the second photoresist layer serving as the mask and being simultaneously removed from the first photoresist layer at the time the unmasked portions of the first photoresist are being etched.

The time and temperature at which the organic insulating material is exposed to the ozone depends on the nature of the organic coating material employed. While elevated temperatures are not a necessity to operability of the process, they do reduce the time required substantially. In general, temperatures of from about room temperature (i.e., 25°C) to about 200°C are operable. For the preferred polyimide insulating material, temperatures of about 100°C are desirably employed.

The precise method by which the ozone is supplied to the organic insulating material is not critical. A convenient method is through use of a plasma generator, in which ozone is generated in situ from oxygen by an electrical discharge. Only a relatively small amount, typically less than 1 percent, of the oxygen supplied to such a generator need be converted to ozone in order to be effective.

The foregoing and other objects, features, and advantages of the invention will be apparent from the following more particular description of preferred embodiments of the invention, as illustrated in the accompanying drawing.

DESCRIPTION OF THE PREFERRED EMBODIMENTS

Figure 1:
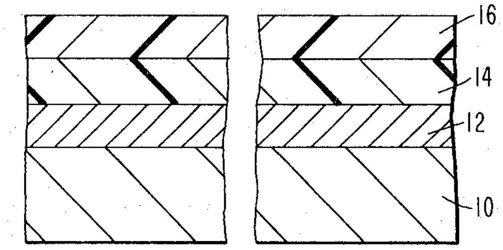
FIGS. 1–4 are cross section views of a portion of an integrated circuit wafer undergoing processing in accordance with the invention.

With the aid of the drawing, a preferred form of a process in accordance with the invention will now be described.

FIG. 1 shows a silicon wafer 10 having a pattern of interconnection lines formed from aluminum layer 12 of approximately 10,000 Angstroms thickness vacuum evaporated on its surface. A passivating layer 14 of polyimide having a thickness of about 10,000 Angstroms is provided over aluminum layer 12 and the remainder of silicon wafer 10. The polyimide layer 14 may be applied by conventional spinning or silk-screening techniques, and it may be fully cured at this point, since the present process is capable of etching the polyimide in a fully cured state. Contact holes are desired through polyimide layer 14 to aluminum interconnection lines 12. It should be recognized that the integrated circuit wafer 10 contains a plurality of diffusions forming transistors, diodes, and resistors of the desired circuit. For the purpose of clarity, such diffusions have not been shown in the drawing.

Figure 2:
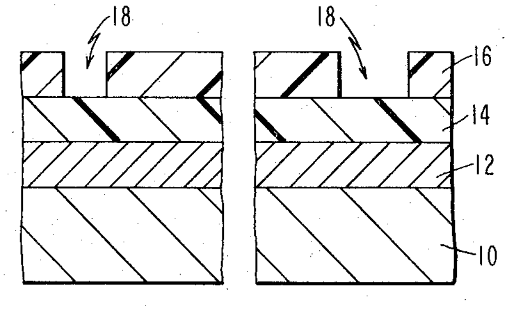

In order to form contact holes (which typically have a diameter of about three one-thousandth inch) in polyimide layer 14, a layer 16 of photoresist in a thickness of about 10,000 Angstroms is applied by spinning techniques over polyimide layer 14. As shown in FIG. 2, a pattern corresponding to the desired contact holes 18 is provided in photoresist layer 16 by exposing the photoresist to light and developing in a conventional manner. The assembly in FIG. 2 is ready for contact with ozone.

Figure 3:
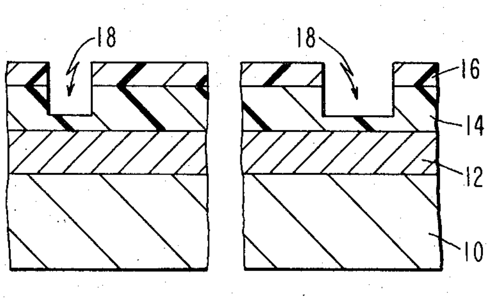
Figure 4:
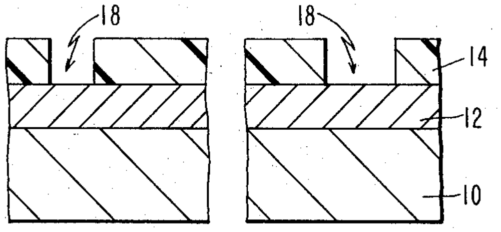

FIGS. 3 and 4 show the results of contacting the assembly in FIG. 2 with ozone, preferably at a temperature of 100°C. The ozone may be supplied by utilizing a flow of oxygen of about 5 cc/min to a commercially available Plasma Machine Model 1101, obtained from the International Plasma Corporation, Hayward, California. 1,000 watts of input power is typically employed, and the pressure in the plasma generator varies between 1 and 10 Torr as the oxygen is bled in. The ozone attacks the polyimide layer 14 in the pattern corresponding to the desired contact holes 18. At the same time the contact holes are being formed in polyimide layer 14, photoresist layer 16 is also attacked by the ozone, causing it to thin out as contact holes 18 are being formed, as shown in FIG. 3.

When contact holes 18 have been completed, as shown in FIG. 4, the ozone is allowed to contact the assembly for a sufficient time to remove completely the photoresist layer 16 protecting areas of polyimide layer 14 in which contact holes 18 are desired. Usually, removal of the photoresist has been completed by the time etching of the desired contact holes 18 has been completed. In practice, the photoresist layer 16 should be applied sufficiently thick to allow polyimide layer 14 to remain at a sufficient thickness for passivating purposes after contact holes 18 have been opened, since the ozone will attack the remainder of polyimide layer 14 after photoresist layer 16 has been removed from it. A convenient way of assuring that this result may be obtained is to make polyimide layer 14 somewhat thicker initially than is required for passivation of the integrated circuit. Then, if some of the polyimide layer 14 in regions where contact holes 18 are not desired is removed after photoresist layer 16 has been removed, passivation of the integrated circuit may still be achieved.

When the contact holes 18 have been etched down to aluminum line 12, overetching is not a critical problem, since ozone will not attack aluminum. Its only effect on aluminum conducting lines 12 is to form a very thin aluminum oxide layer on their surface. This aluminum oxide layer presents no particular problem, since it is dissipated in subsequent deposition and annealing of contact metallurgy in contact holes 18.

The following non-limiting examples describe the invention further.

EXAMPLE I

Patterns are etched through a polyimide layer of approximately 10,000 Angstroms thickness to a vacuum deposited aluminum layer of approximately 10,000 Angstroms thickness on a silicon semiconductor wafer. A commercially available DuPont Pyre-M.L. RC-5057 polyimide solution is diluted in a ratio of 3 parts by weight of the polyimide solution to 1 part by weight of N-methyl-2-pyrrolidone solvent. The thus diluted polyimide solution is applied to the semiconductor wafer by spinning at 2,000 RPM for 6 minutes. The resulting polyimide layer is completely cured by heating at 400°C for one-half hour. A layer of KTFR photoresist, obtained from the Eastman Kodak Company, Rochester, NY, and diluted in a ratio of 3parts by weight photoresist to 4 parts by weight xylene is applied over the polyimide by spinning at 3,600 RPM for 1 minute. The photoresist is prebaked at 95°C for 20 minutes. An array of holes having a dimension of 0.5/1000 inch is exposed and developed in the phootresist, followed by postbaking at 170°C for 1 hour. The semiconductor wafer is then placed in a Plasma Machine Model 1101, obtained from the International Plasma Corporation, Hayward, CA, and etched for 80 seconds by bleeding in 5 cc/min. of oxygen to produce a pressure of 5–10 Torr, utilizing a power input of 1,000 watts.

Subsequent examination shows that the pattern of holes has been etched in the polyimide down to the aluminum layer with good definition and the photoresist has been completely removed. The remainder of the polyimide layer is intact and no visible attack at 400X magnification is observed on the 10,000 Angstroms aluminum film. This example shows that the present process may be used for etching contact holes in polyimide passivating layers for integrated circuits, since the process is shown to be capable of etching a dimension of 0.5/1000 inch, and such contact holes typically have a diameter of about three one-thousandth inch.

EXAMPLE II

The procedure of Example I is repeated but utilizing a positive photoresist both as the organic coating material and as a mask. AZ–1350H photoresist, obtained from the Shipley Company, Incorporated, Newton, Mass. is applied to a semiconductor wafer by spinning at 3,400 RPM for 60 seconds, then baking for 1 hour at 160°C to give the coating layer, in this case over a substrate of 10,000 Angstroms thick sputtered $SiO_2$ on a silicon semiconductor wafer. A second layer of the photoresist is spin applied, baked for 15 minutes at 85°C, exposed in an array of 0.5/1000 inch holes, developed, and postbaked for 30 minutes at 135°C. The wafer is then exposed to ozone as in Example I.

Subsequent examination shows etching of the 0.5/1000 inch patterns in the first photoresist layer down to the $SiO_2$ and removal of the second photoresist layer, with no attack on the $SiO_2$. This example shows that the invention is operable with a different type of polymer than polyimide, with a positive as well as a negative resist, and with a different substrate than aluminum.

Substitution of other organic coating materials as described above, other masking layers, and other substrate materials, either as thin films or in bulk, gives similar advantageous results.

It should now be apparent that a process for etching organic coating materials capable of attaining the stated objects has been provided. In summary, the process may be utilized for etching such high temperature stable and chemically resistant organic insulating materials as polyimide overlying metallic films, such as aluminum metallurgy. If an organic material, such as a photoresist, is used as the mask to define desired patterns in the organic coating material, the masking layer itself may be removed at the same time etching of the desired patterns in the organic coating material is accomplished. The result is a simplified, one step etching process not requiring a separate resist stripping operation. Although especially suited for use in fabricating integrated circuits, the present process, because of its simplicity and reliability, should find application in a wide variety of other fields as well.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process for the selective removal of an organic material selected from the group consisting of polyimide, a phenolic resin, and an acrylic resin from an inorganic substrate free of attack by ozone, which comprises masking portions of said organic material with a photoresist, then contacting both unmasked portions of said organic material and said photoresist with ozone to remove unmasked portions of said organic material from said substrate, and simultaneously remove said photoresist from said organic material.

2. The process of claim 1 in which said substrate comprises aluninum.

3. In the fabrication of an integrated circuit, the improvement comprising:

A. forming aluminum lines for electrically interconnecting portions of said circuit, B. applying a polyimide passivation layer over said aluminum lines and said circuit, C. forming a photoresist masking layer over said polyimide passivating layer except where contact to said aluminum interconnections is desired, and D. contacting unmasked portions of said polyimide passivating layer and said photoresist masking layer with ozone for a sufficient time to remove the unmasked portions of said polyimide passivating layer and said photoresist masking layer, whereby said aluminium interconnections are exposed at the unmasked areas of said polyimide passivating layer, and said polyimide passivating layer remains where it was covered by said photoresist masking layer.

4. A process for the selective removal of an organic coating material selected from the group consisting of polyimide, a phenolic resin and an acrylic resin from a metal film which is free of attack by ozone, which comprises forming a photoresist masking layer over selected areas of said organic coating material, and contacting unmasked portions of said organic coating material and said photoresist masking layer with ozone for a sufficient time to remove the unmasked portions of said organic coating material from said metal film, whereby complete removal of unmasked organic coating material and said photoresist masking layer is achieved while maintaining said metal film intact.

5. The process of claim 4 in which said metal film is an aluminum film.

6. The process of claim 4 in which said organic coating material comprising polyimide.

* * * * *